United States Patent [19]
Rettinger, Jr. et al.

[11] 3,983,506
[45] Sept. 28, 1976

[54] ACQUISITION PROCESS IN A PHASE-LOCKED-LOOP BY GATED MEANS

[75] Inventors: Lawrence John Rettinger, Jr.; Layton Balliet, both of Huntsville, Ala.

[73] Assignee: International Business Machines Corporation, Armonk, N.Y.

[22] Filed: July 11, 1975

[21] Appl. No.: 595,250

[52] U.S. Cl. .............................. 331/17; 325/421; 328/155; 331/1 A; 331/14; 331/27
[51] Int. Cl.² .......................................... H03B 3/04
[58] Field of Search ............... 331/1 A, 17, 14, 27; 328/155; 325/421

[56] References Cited
UNITED STATES PATENTS

| | | |
|---|---|---|
| 3,223,943 | 12/1965 | Dumaire et al. .......................... 331/17 |
| 3,328,719 | 6/1967 | Lisle et al. .............................. 331/17 |
| 3,805,182 | 4/1974 | Melcher................................. 331/17 |
| 3,882,412 | 5/1975 | Apple, Jr. ............................. 331/1 A |

*Primary Examiner*—John Kominski
*Attorney, Agent, or Firm*—John G. Wynn

[57] ABSTRACT

A phase-locked-loop circuit configuration is described which eliminates the statistical nature of the acquisition process, thereby improving or decreasing the acquisition or lock-up-time of the loop. The circuit configuration is such that given an input signal, that occurs at time $T_0$, the loop error signal is reduced to a level where the lock-up-time is substantially reduced and predictable to a degree of certainty heretofore unattainable. In addition, by eliminating the statistical nature of the acquisition process, lock-up-time becomes a function of controllable system parameters, such as bandwidth, gain and circuit time constants.

1 Claim, 4 Drawing Figures

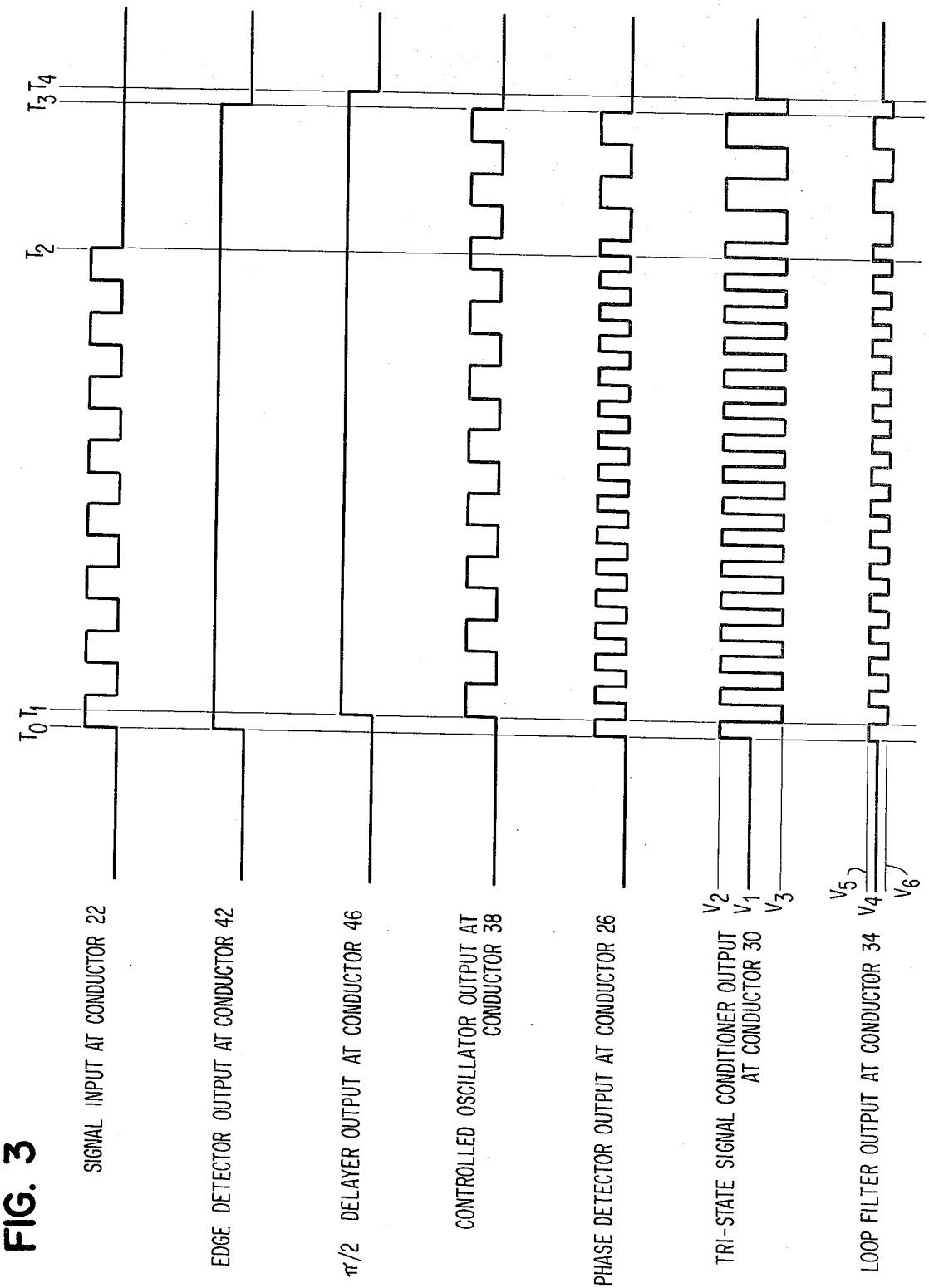

ACQUISITION PROCESS IN A PHASE-LOCKED-LOOP BY GATED MEANS

CROSS REFERENCE TO RELATED APPLICATION

Application Ser. No. 591,385, filed June 30, 1975, entitled "Improvement of the Acquisition Process in a Phase-Locked-Loop by Switched Phase Means" by Layton Balliet, and assigned to the same assignee as this application contains related subject matter.

BACKGROUND OF THE INVENTION

1. Field of the Invention

The invention relates generally to improvements in phase-locked-loop systems, and more particularly, to a phase-locked-loop circuit configuration which eliminates the statistical nature of the acquisition process, thereby, affording a substantial reduction in, and predictability of loop lock-up-time.

2. Description of the Prior Art

A basic prior art phase-locked-loop is depicted in FIG. 1a. Initially, a signal coupled to input signal conductor 10 is applied to phase detector 12. This signal is compared in phase detector 12 with a feedback signal applied to conductor 14 by free-running controlled oscillator 16. Depending on the application employed, controlled oscillator 16 is disclosed in the prior art either as a voltage controlled oscillator (VCO), or a current controlled oscillator (CCO). Consequently, the output of phase detector 12 at conductor 18 is an error signal which is a function of the phase difference between the input signal at conductor 10 and the feedback signal at conductor 18. This error signal, in turn, is applied to loop filter 20, which conditions the error signal providing at conductor 22 a signal suitable for controlling controlled oscillator 16. The signal at conductor 22 is such as to cause a change in the frequency of operation of controlled oscillator 16 in a direction that reduces the error signal at conductor 18 to a minimum level. This is the classic locked condition of a phase-locked-loop and, accordingly, the output signal at conductor 14 tracks the input signal at conductor 10.

Acquisition or the time it takes a phase-locked-loop, such as the circuit of FIG. 1a, to lock up is statistical or random in nature. In some applications, such as standard radio communications and color television communications, the acquisition process is not of primary importance when weighed against overall system design goals. Thus, the basic phase-locked-loop of FIG. 1a would suffice, in the previously indicated applications, notwithstanding the statistical nature of acquisition. However, in some other communication applications, such as digital communication systems and space communication systems, it is important to be able to decode or demodulate the intelligence immediately, since a delay could mean the loss of valuable information; therefore, the acquisition process is of primary importance. In addition to fast acquisition, predictable acquisition is also important in systems of the type aforementioned. Thus, the acquisition process can be broken down into two components, i.e., speed of acquisition and the predictability of acquisition. The separate components, to some degree, are dependent on each other.

The statistical nature of the acquisition process can better be understood by referring to the phase plane diagram, for a first order phase-locked-loop, illustrated in FIG. 1b. Although the phase-locked-loop, previously described, in FIG. 1a, is a second order system, the phase plane diagram of FIG. 1b will suffice to explain the acquisition process. In FIG. 1b, $\phi$ is the phase of the feedback signal relative to the input signal, and $\dot\phi$ is the rate of change of phase and is proportional to the error signal. Acquisition is defined, in the art, as the time required for a phase-locked-loop to reach a condition where the error signal is near zero at a stable null (depicted as $\pi/2$ in FIG. 1b). As is well known, some error signal is always necessary in order for the loop to track properly once acquisition is attained. Thus, as will be explained hereinbelow, theoretically, acquisition in the phase-locked-loop of FIG. 1a can vary from zero to infinity.

Concurrently referring to the basic phase-locked-loop of FIG. 1a and the phase plane diagram of FIG. 1b, a signal energizing the loop at conductor 10 has a probability of being in phase with free-running controlled oscillator 16. This in phase stable condition is depicted in FIG. 1b as the stable null $\pi/2$. There is also a porbability that an input signal, when initially received will be 180° out of phase with free-running controlled oscillator 16. This condition is depicted in FIG. 1b as the unstable null at $3\pi/2$ or the unstable null at $-3\pi/2$. In addition, there is a probability that the phase relationship between the input signal and controlled oscillator 16 is initially at some point between the previously mentioned limits and the stable null $\pi/2$. In actual practice, however, the loop will not stay at an unstable null for an indefinite time, primarily, due to system perturbations, such as noise. Accordingly, as is illustrated in FIG. 1b, controlled oscillator 16, at some point in time, will be driven off of the unstable nulls following the path indicated by the arrows. For example, if controlled oscillator 16, after the application of an input signal, is instantaneously at either of the unstable nulls $3\pi/2$ or $-3\pi/2$, controlled oscillator 16 will stay at one of the previously mentioned unstable nulls. But given a change in system conditions, such as frequency or noise, controlled oscillator 16 will be driven off of the unstable null, following the path indicated by the arrows, increasing its velocity $\dot\phi$, and finally, arriving at the stable $\pi/2$. However, the time it takes to accomplish the foregoing is indeterminate, since there is no assurance of how long the system will stay locked on an unstable null. Of course, once the system is driven from an unstable null, the time it takes to reach a stable null depends on the inertia in the sytem and can be determined to a degree of certainty by the parameters of the system. Computer studies have been made, given a random input signal, to determine the probability of acquisition for phase-locked-loops of the type depicted in FIG. 1a. For example, see, S. L. Goldman's article, entitled "Second-Order Phase-Locked-Loop Acquisition Time in the Presence or Narrow-Band Gaussian Noise," *IEEE Transactions on Communications*, 297–300, October, 1973.

There are methods, according to the prior art, to improve acquisition. One well known method is to increase the loop bandwidth. As is known to those with skill in the art, increasing the bandwidth of the loop increases $\dot\phi$, the rate of change of phase. As previously mentioned, $\dot\phi$ is proportional to the error signal; therefore, increasing the bandwidth of the loop improves acquisition since an increase in $\dot\phi$ increases the loop acceleration allowing the loop oscillator to approach a stable null more quickly (see FIG. 1b). Nevertheless, there is still a probability during initial acquisition to be on an unstable null. Accordingly, there is still an uncertainty, even though the uncertainty has been improved, as to how long the system will remain on an unstable null.

Another method, that is well documented in the prior art, is the utilization of a sweep frequency. This method definitely improves acquisition, especially if the phase-locked-loop is on an unstable null initially. On the other hand, if the phase-locked-loop is off of an unstable null initially, the utilization of a sweep technique can drive the system into an unstable null, since there is no prior knowledge as to the proper direction to sweep. Consequently, while the aforesaid technique improves acquisition, there is still an uncertainty when utilizing this method.

Still another prior art technique, which operates in practice similarly to the sweep technique, is to inject noise into the system. Given that the system is initially on an unstable null, the injected noise will drive the system off of the unstable null at a predetermined time depending on when the noise is applied. Thus, theoretically, the system will be driven off of an unstable null more quickly. But unfortunately, there is always the probability that, initially, the system will be at some point between a stable null and an unstable null; therefore, there is always a probability that the injected noise will dirve the system into an unstable null rather than a stable null. This possibility is clearly depicted in FIG. 1b.

Other elaborate and sophisticated prior art systems have been devised to improve acquisition such as the "Automatic Carrier Acquisition System" of Fletcher et al., U.S. Pat. No. 3,746,998; the "Quadriphase Modem" system of Wolejsza, Jr., U.S. Pat. No. 3,594,651; and the "Automatic Signal Acquisition Means for Phase-Lock-Loop with Anti-sideband Lock Protection" of Brown et al., U.S. Pat. No. 3,768,030.

While all of the aforementioned prior art systems and techniques tend to improve the acquisition process, the uncertainties, which tend to make it difficult to predict acquisition with a degree of accuracy necessary for reliable utilization of phase-locked-loops in communication systems of the type previously mentioned, have not been eliminated.

OBJECTS OF THE INVENTION

Accordingly, a principle object of the present invention is to eliminate the statistical nature of the acquisition process.

A further object of the present invention is to improve acquisition, with certainty, to a level heretofore unobtainable.

It is yet another object of the present invention to eliminate complex circuitry and equipment, thereby, proportionally increasing system reliability to a level heretofore unattainable.

SUMMARY OF THE INVENTION

The phase-locked-loop circuit configuration, according to the invention, by which these and other objects, features and advantages are accomplished is characterized by a phase detector for comparing an input signal and a feedback signal generated by a gated controlled oscillator. In addition, the input signal is also applied to an edge detector which detects the positive going edge of the input signal providing at its output a positive going step signal. This output, in turn, is applied to a $\pi/2$ delayer and a tri-state signal conditioner. The output of the phase detector, previously mentioned, is also connected to the tri-state signal conditioner. Thus, having the proper signals at its input, the tri-state signal conditioner provides at its output an error signal having three levels. The three level error signal is further conditioned by means of a loop filter. The output signal of the loop filter, in turn, biases the gated controlled oscillator to a pre-set level at a point near the frequency of the input signal during the absence thereof. However, when an input signal is present, the output signal from the edge detector is delayed by the $\pi/2$ delayer. Consequently, this delayed signal gates the gated controlled oscillator on at a point in time equivalent to $\pi/2$ after the arrival of the input signal and at the frequency of the input signal. Accordingly, the gated controlled oscillator instantaneously locks onto the stable null $\pi/2$, thereby, eliminating the statistical nature of acquisition. Moreover, the speed of acquisition is now limited only by controllable system parameters as previously mentioned in the "Background of the Invention." During this locked condition, the output of the tri-state signal conditioner provides an error signal which allows the gated control oscillator to track at the frequency of the input signal providing an output signal in synchronization therewith. Thus, the gated controlled oscillator is on only during the presence of an input signal, and, accordingly, is gated on only at or near the stable null $\pi/2$.

BRIEF DESCRIPTION OF THE DRAWINGS

The foregoing and other objects, novel features and advantages of the invention will be apparent from the following more particular description of the preferred embodiment as illustrated in the accompanying drawings, in which:

FIG. 3 is a timing diagram showing the interrelationship of the various wave forms of the present invention during the operation thereof.

DESCRIPTION OF THE PREFERRED EMBODIMENT

Figure 1A:
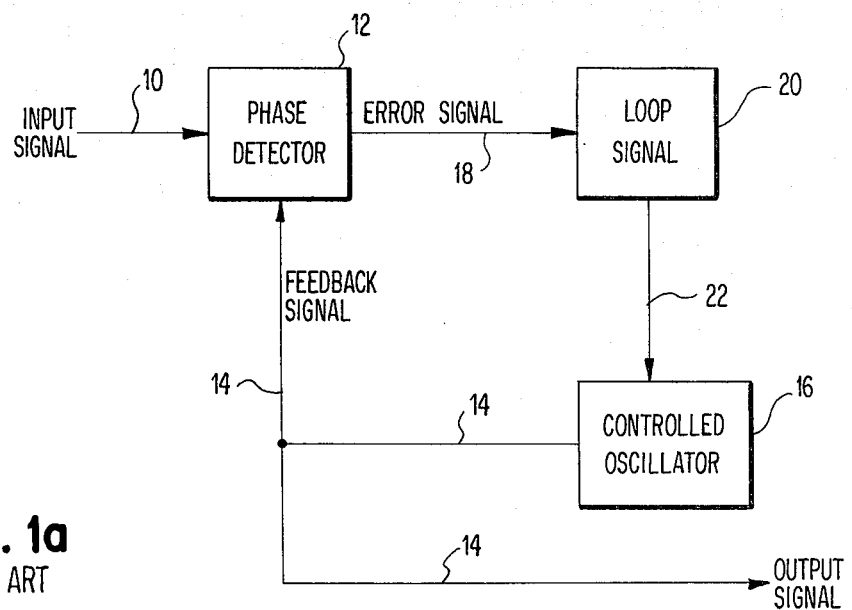
FIG. 1a is a block diagram representation of a basic prior art phase-locked-loop utilized to lllustrate and explain the acquisition process.
Figure 1B:
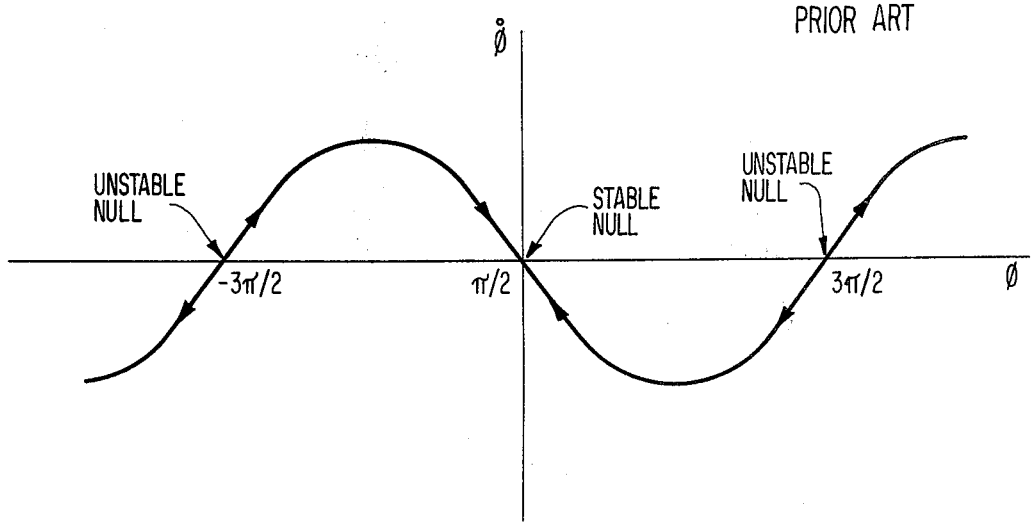
FIG. 1b is a first order phase plane diagram utilized to further illustrate and explain the acquisition process.
Figure 2:
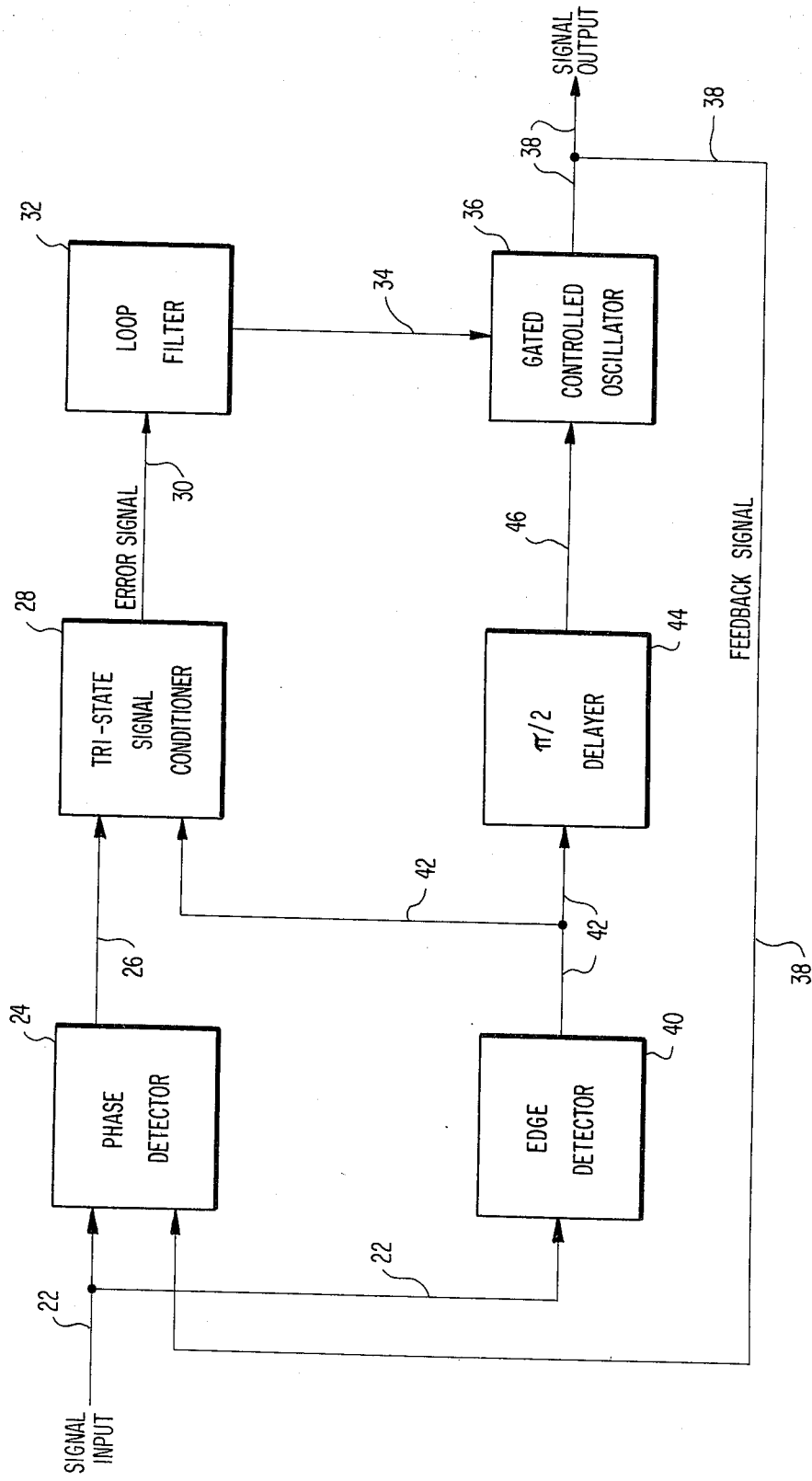
FIG. 2 is a block diagram representation of the preferred embodiment of the phase-locked-loop configuration of the present invention.

FIG. 2 shows, in block diagram form, an embodiment of the gated phase-locked-loop configuration of the instant invention. The invention is in the combination embodied in the configuration, shown and the improved results obtained therefrom. The invention, as characterized by the circuit blocks in FIG. 2, can easily be fabricated, it is believed, by one with ordinary skill after the description of the invention, hereinbelow, and the "Statement of the Operation" of the invention, hereintofollow.

Still referring to FIG. 2, a signal is inputted on input signal conductor 22. This signal is applied to a first input of phase detector 24. Depending on the type of input signal utilized, i.e., analog or digital, the frequency of the input signal and the type of data inherent in the input signal, phase detector 24 can take many forms. For the preferred embodiment of the invention, phase detector 24 is an EXCLUSIVE OR circuit designed to operate in the 2 Mhz region of the frequency spectrum. An EXCLUSIVE OR circuit with two inputs, as shown in FIG. 2, is also termed a half-adder. This circuit provides a logical "1" when the input variables are different and provides a logical "0" when the input variables are the same. Thus, an EXCLUSIVE OR circuit operates as a phase detector and is widely used for this purpose in digital applications.

Continuing, the output of phase detector 24 is connected, via phase detector output conductor 26, to a first input of tri-state signal conditioner 28. Tri-state signal conditioner 28, for purposes of the invention, is a circuit that provides a digital signal, having three distinct levels, at tri-state signal conditioner output conductor 30. Tri-state signal conditioner 28 comprises an inverter connected to a first open collector NAND gate. The output of this NAND gate is connected to one side of the primary of a balanced transformer having its center tap connected to a positive voltage. A second open collector NAND gate is connected to the remaining terminal of the transformer primary. The signal at phase detector output conductor 26 is connected to the previously mentioned inverter and to one input of the second NAND gate. Also connected to the first and second NAND gates is edge detector output conductor 42. One end of the secondary winding of the aforementioned transformer is connected through a resistor to a positive voltage. The other secondary connection forms the output terminal of tri-state signal conditioner 28 at conductor 30. The foregoing is just one example of a circuit that will perform the function of tri-state signal conditioner 28 given the input signals and the required output signal. (The required output signal at conductor 30 is shown in FIG. 3 and will be discussed more fully in conjunction with the operation of the invention.)

The three level error signal at conductor 30 is further conditioned by means of loop filter 32. Loop filter 32 comprises a series resistor in one leg and a resistor in series with a capacitor to ground in the other leg. Loop filter 32, via loop filter output conductor 34, provides a control signal to gated controlled oscillator 36. Gated controlled oscillator 36, as utilized in the present invention, is a bistable multivibrator, the design of which is well documented in the art. The signal at gated controlled oscillator output conductor 38 is the signal output of the configuration of the present invention, and, as indicated, is also the feedback signal to phase detector 24.

The input signal at conductor 22 is also applied to edge detector 40 which detects the positive going edge of the input signal providing at edge detector output conductor 42 a positive going step voltage only if an input signal is present. Edge detector 40, for purposes of the invention, comprises a fast charge/slow discharge coupling circuit having a diode input, a resistor-capacitor to ground and an active device for amplification. This circuit, as utilized in the instant invention, is well known in the art.

Continuing, the positive going step signal, in turn, is applied to a second input of tri-state signal conditioner 28, aforementioned, and $\pi/2$ delayer 44. $\pi/2$ delayer 44 delays the positive going step voltage for a period $\pi/2$, thereby, providing the proper signal at $\pi/2$ delayer output conductor 46 for gating on gated controlled oscillator 36. For purposes of the invention, $\pi/2$ delayer 44 is an astable multivibrator. This circuit, as utilized in the present invention, is well known in the art.

STATEMENT OF THE OPERATION

Details of the operation, according to the invention, is explained in conjunction with FIGS. 2 and 3 viewed concurrently.

Referring now to the block diagram of FIG. 2 and the timing diagram of FIG. 3, at a time prior to $T_0$, there is no signal; therefore, the signal input at conductor 22 is at a down or zero level. Consequently, the output of edge detector 40 at conductor 42 and the output of $\pi/2$ delayer 44 at conductor 46 are also at down levels. Since there is no gating signal present at conductor 46, gated controlled oscillator 36 is off, and its output and feedback signals at conductor 38 are at down levels. In addition, the output of phase detector 24 at conductor 26 is also at a down level as illustrated in FIG. 3. However, since both inputs of tri-state signal conditioner 28, at a conductors 26 and 42, are at down or zero levels, its output at conductor 30 is at a steady state level of $V_1$ as shown in FIG. 3. Thus, the output of loop filter 32 at conductor 34 is at a steady state level $V_4$ which is less than the previously mentioned steady state level $V_1$. The steady state level $V_4$ biases gated controlled oscillator 36 at a point that enables it to start oscillating at the frequency of the input signal when it is gated on.

To continue, at a time slightly after $T_0$, the first positive edge of the input signal appears at conductor 22. Simultaneously, edge detector 40 detects the presence of the input signal providing a positive going step voltage at conductor 42. In turn, this positive going step voltage is applied to the second input of tri-state signal conditioner 28 and the input of $\pi/2$ delayer 44 as shown in FIG. 2. The output signal of gated controlled oscillator 36 at conductor 38 is still at a down or zero level at this point in time. However, the input conditions at conductors 22 and 38 at phase detector 24 are such that an up level is provided at conductor 26.

As shown in FIG. 3, the conditions at the first and second inputs of tri-state signal conditioner 28 are such that its output at conductor 30 rises to a positive level $V_2$. Accordingly, steady state level $V_4$, at conductor 34, raises slightly to a more positive level $V_5$.

At time $T_1$, $\pi/2$ later than time $T_0$, a gating signal is provided at the output of $\pi/2$ delayer 44 at conductor 46. This signal gates gated controlled oscillator 36 on. Thus, gated controlled oscillator 46 provides an up level at conductor 38. Since the inputs to phase detector 24 are at up levels, its output at conductor 26 drops to a down or zero level as shown in FIG. 3. Consequently, the output of tri-state signal conditioner 28 at conductor 30 drops to a less positive level $V_3$. Loop filter 32 responds to this voltage transition providing at conductor 34 a level $V_6$ slightly more negative than $V_4$ as shown. Accordingly, gated controlled oscillator 36 is now tracking the input signal and will continue to do so as depicted in FIG. 3.

At a time $T_2$, the input signal at conductor 22 drops to a down level for a period greater than two cycles as depicted. However, due to the circuit time constant, the output of edge detector 40 stays up until a time $T_3$. All circuit conditions remain the same during the period from $T_2$ to $T_3$ as shown in FIG. 3. But at time $T_4$, the output of $\pi/2$ delayer 44 at conductor 46 drops to a down level; therefore, all signal levels, as shown in FIG. 3, revert back to the signal conditions prior to $T_0$.

It is important to note that gated controlled oscillator 36 is gated on at the stable null $\pi/2$. Thus, for all practical purposes, acquisition is instantaneous. In practical applications, there is always a phase error between the input signal and the controlled oscillator output signal in a phase-locked-loop. In the present case, that error is $\pi/2$ or ¼ of a cycle in reference to the input signal. Further, it is important to note that the input signal, as depicted in FIG. 3, is an ideal signal for the purposes of illustrating and explaining the operation of the invention. In actual practice, the duty cycle of the input signal might vary due to transmission conditions. Nevertheless, the instant invention will operate properly with such a wave form since detecting the positive edge of the input signal is all that is necessary in order for the system to operate properly as discussed hereinbefore.

While the invention has been particularly described with reference to the preferred embodiment thereof, it will be understood by those skilled in the art that various changes in form and detail may be made therein without departing from the spirit and scope of the invention.

What is claimed is:

1. A phase-locked-loop circuit configuration for improving the acquisition process comprising:

phase detector means for comparing the phase between an input signal and a feedback signal providing at its output an error signal proportional thereto;

edge detector means driven by said input signal for detecting the positive edge thereof providing at its output a positive going step signal;

tri-state signal conditioner means having a first input driven by said error signal from said phase detector means, and a second input driven by said positive going step signal from said edge detector means for providing at is output an error signal having three levels;

loop filter means driven by said error signal having three levels for further conditioning said three level error signal;

gated controlled oscillator means driven by said further conditioned three level error signal for providing an output signal that tracks said input signal, and for providing said feedback signal to said phase detector, said further conditioned three level error signal biasing said gated controlled oscillator at a point which enables said gated control oscillator to be turned on at the frequency of said input signal and at the stable null $\pi/2$ when a gating signal is present;

$\pi/2$ delayer means driven by said positive going step voltage from said edge detector means for delaying thereof, said delayed positive going step signal gating said gated controlled oscillator on;

said gated controlled oscillator locking up at said stable null $\pi/2$ and at said frequency of said input signal and eliminating the statistical nature of said acquisition process and decreasing the lock-up-time of the loop.

* * * * *

UNITED STATES PATENT AND TRADEMARK OFFICE
CERTIFICATE OF CORRECTION

PATENT NO. : 3,983,506

DATED : September 28, 1976

INVENTOR(S) : Lawrence John Rettinger, Jr. & Layton Balliet

It is certified that error appears in the above—identified patent and that said Letters Patent are hereby corrected as shown below:

Claim 1, Column 8, line 5, the word "is" should read --its--.
Claim 1, Column 8, line 21, the word "voltage" should read --signal--.

Signed and Sealed this

Twenty-sixth Day of April 1977

[SEAL]

Attest:

RUTH C. MASON
Attesting Officer

C. MARSHALL DANN
Commissioner of Patents and Trademarks